US 6,649,464 B2

(12) United States Patent
Lee

(10) Patent No.: US 6,649,464 B2
(45) Date of Patent: Nov. 18, 2003

(54) METHOD FOR MANUFACTURING SEMICONDUCTOR DEVICE HAVING CAPACITOR AND VIA CONTACT

(75) Inventor: Ki-Young Lee, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/199,401

(22) Filed: Jul. 18, 2002

(65) Prior Publication Data
US 2003/0027386 A1 Feb. 6, 2003

(30) Foreign Application Priority Data
Aug. 4, 2001 (KR) ........................................ 2001-47145

(51) Int. Cl.[7] .......................................... H01L 21/8242
(52) U.S. Cl. ....................... 438/238; 438/250; 438/253; 438/393; 438/396
(58) Field of Search ......................... 438/238, 250–256, 438/381, 393–399

(56) References Cited

U.S. PATENT DOCUMENTS 6,025,226 A    2/2000  Gambino et al.
6,313,003 B1 * 11/2001 Chen .......................... 438/396
6,329,234 B1 * 12/2001 Ma et al. .................... 438/210
6,391,713 B1 *  5/2002 Hsue et al. .................. 438/253

* cited by examiner

Primary Examiner—Carl Whitehead, Jr.
Assistant Examiner—Thanh Nguyen
(74) Attorney, Agent, or Firm—Marger Johnson & McCollom, P.C.

(57) ABSTRACT

Methods for manufacturing semiconductor devices are provided. First and second portions of a first metal layer are formed in a first interlayer insulating layer. A second interlayer insulating layer is formed to cover the first portion and has an opening that exposes the second portion. A dielectric layer is formed on the exposed second portion. A second metal layer is formed on the dielectric layer to fill the opening in a capacitor region. A via contact hole to expose the first portion is formed in the second insulating layer. A third metal layer is formed in the via contact hole. A third interlayer insulating layer is formed on the second interlayer insulating layer. Contact holes to expose the second metal layer and the third metal layer are formed in the third interlayer insulating layer. A fourth metal layer is formed in the contact holes.

21 Claims, 7 Drawing Sheets

METHOD FOR MANUFACTURING SEMICONDUCTOR DEVICE HAVING CAPACITOR AND VIA CONTACT

This application claims priority from Korean Patent Application No. 2001-47145, filed on Aug. 4, 2001, the contents of which are incorporated herein by reference in their entirety.

BACKGROUND OF THE INVENTION

1. Field of the Invention

The present invention relates to a method for manufacturing a semiconductor device, and more particularly, to a method for manufacturing a semiconductor device having a capacitor and a via contact

2. Description of the Related Art

In recent years, as the integration density of semiconductor devices increases, the area occupied by individual devices continues to decrease. Specifically, a capacitor for storing data of a dynamic random access memory (DRAM) is required to have sufficient capacitance irrespective of the decrease in the area occupied by the capacitor. Accordingly, a metal-insulator-metal (MIM) capacitor, in which a lower electrode and an upper electrode are formed of metal, has been suggested.

In order to form upper and lower electrodes of a metal layer in a MIM capacitor, an etching process for patterning the metal layer is required. However, as the integration density of semiconductor devices increases, it becomes more difficult to etch the metal layer. In particular, copper, which has good electromigration resistance and a low resistivity of about 1.7 Wcm, is very difficult to etch. Accordingly, a method for forming upper and lower electrodes through a damascene process, in which a process for etching a metal layer is not performed, has been proposed. In U.S. Pat. No. 6,025,226, a method for forming a MIM capacitor and a via contact using a damascene process is disclosed. This method will be described with reference to the accompanying drawings.

FIGS. 1 through 7 are cross-sectional views illustrating a conventional method for forming a MIM capacitor and a via contact using the damascene process disclosed in U.S. Pat. No. 6,025,226. As shown in FIG. 1, a first interconnection layer 101, which includes a first conductive interconnection 110 and a second conductive interconnection 115, is formed on a first interlayer insulating layer 105. Next, a second interlayer insulating layer 107 is formed on the first and second conductive interconnections 110 and 115. As shown in FIG. 2, the second interlayer insulating layer 107 is patterned, thereby forming a first opening 120 and a second opening 130. The first and second openings 120 and 130 expose the surfaces of the first and second interconnections 110 and 115, respectively.

As shown in FIG. 3, an insulating layer 122 is deposited on the entire surface of the structure including the first and second openings 120 and 130. Next, as shown in FIG. 4, a trench 132 is formed over the second opening 130. During an etching process for forming the trench 132, the first opening 120 and the insulating layer 122 in the first opening 120 are protected from the etching process by a predetermined mask layer pattern. On the other hand, during the etching process, the insulating layer 122 formed at the bottom of the second opening is removed. The trench 132 has a width greater than the width of the second opening 130.

Next, as shown in FIG. 5, a first conductive material 124 is deposited in the first and second openings 120 and 130 and is polished until the second interlayer insulating layer 107 is exposed. Next, as shown in FIG. 6, a third interlayer insulating layer 109 is formed on the second interlayer insulating layer 107 and the first conductive material 124 and is patterned to form a third opening 140. The third opening 140 exposes the surface of the first conductive material 124 filling the first and second openings 120 and 130. Next, as shown in FIG. 7, a second conductive material is deposited on the resulting structure including the third opening 140 to fill the third opening 140.

Because the conventional method for forming a MIM capacitor and a via contact employs a damascene process, there is no need to perform an etching process on a metal layer which can hardly be etched. However, this method has the following problems.

First, the insulating layer 122 is simultaneously formed on a MIM capacitor region and a via contact region. Because the insulating layer 122 acts as a dielectric layer of the MIM capacitor, the insulating layer 122 must be formed in the MIM capacitor region. However, it must not exist in the via contact region. Accordingly, the insulating layer 122 formed at the bottom of the second opening 130 in the via contact region must be removed, as shown in FIG. 4. Between removing the insulating layer 122 from the bottom of the second opening 130 and forming a barrier metal layer (not shown), a radio frequency (RF) etching process must be performed to remove a native oxide layer. However, the RF etching process may damage the surface of a capacitor dielectric layer. Accordingly, the performance of a MIM capacitor may deteriorate.

Second, because the insulating layer 122 exists on the sidewalls of the first conductive material 124, the resistance of a via contact decreases, but the aspect ratio of the via contact increases. Accordingly, it becomes difficult to properly deposit the first conductive material.

SUMMARY OF THE INVENTION

A method for manufacturing a semiconductor device having a via contact and a capacitor includes forming first and second portions of a first metal layer in trenches formed in a first interlayer insulating layer. A second interlayer insulating layer is formed to cover the first portion of the first metal layer and has an opening that exposes the second portion of the first metal layer. A dielectric layer is formed on the exposed second portion of the first metal layer. A second metal layer is formed on the dielectric layer to fill the opening in a capacitor region. A via contact hole to expose the first portion of the first metal layer is formed in the second insulating layer. A third metal layer is formed in the via contact hole. A third interlayer insulating layer is formed on the second interlayer insulating layer. Contact holes to expose the second metal layer and the third metal layer are formed in the third interlayer insulating layer. A fourth metal layer is formed in the contact holes.

Preferably, forming the first metal layer includes forming a mask layer pattern that exposes the via contact region and the capacitor region on the first interlayer insulating layer, forming trenches a predetermined distance apart in the via contact region and the capacitor region by etching the first interlayer insulating layer to a predetermined depth using the mask layer pattern as an etching mask, removing the mask layer pattern, forming a metal layer to fill the trenches, and forming the first and second portions of the first metal layer to be isolated from each other by planarizing the resulting structure including the first metal layer to expose the surface of the first interlayer insulating layer. The method may further include forming a first barrier metal layer between the first interlayer insulating layer and the first metal layer.

Preferably, the method may further include forming a first capping layer on the surfaces of the first interlayer insulating layer and the first metal layer after forming the first metal layer. Here, the first capping layer may be formed of nitride to a thickness of 200–1000 Å.

The second interlayer insulating layer and the first capping layer are etched to have an opening therein to expose the surface of the first metal layer in the capacitor region. The second interlayer insulating layer is preferably formed of oxide to a thickness of 3000–10000 Å.

The dielectric layer is preferably an oxide layer, a nitride layer, or a composite layer including an oxide layer and a nitride layer.

Forming the second metal layer preferably includes forming a second metal layer on the dielectric layer and planarizing the resulting structure including the second metal layer to expose the surface of the second interlayer insulating layer. The method may further include forming a second barrier metal layer between the dielectric layer and the second metal layer. The method may further include performing an RF etching process in a state where the first mask layer pattern remains after forming the via contact. Here, the second capping layer may be formed of nitride.

The method may further include forming a third barrier metal layer to contact the surface of the first metal layer in the via contact region before forming the third metal layer. The method may further include forming a fourth barrier metal layer to contact the surfaces of the second metal layer and the third metal layer in the contact holes before forming the fourth metal layer.

Preferably, the first and second portions of the first metal layer, the second metal layer, the third metal layer, and the fourth metal layer are formed of copper. Here, the second metal layer, the third metal layer, and the fourth metal layer are preferably formed by forming a copper seed layer by techniques such as sputtering and depositing copper on the copper seed layer by electroplating.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
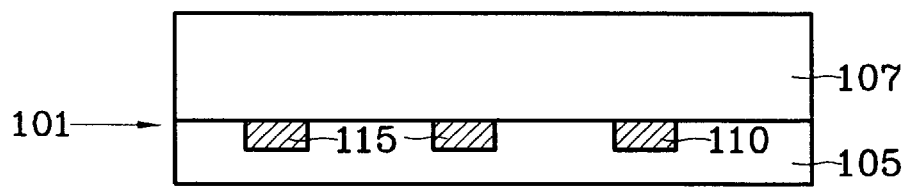
FIGS. 1 through 7 are cross-sectional views illustrating a conventional method for manufacturing a semiconductor device having a capacitor such as a MIM capacitor and a via contact.
Figure 2:
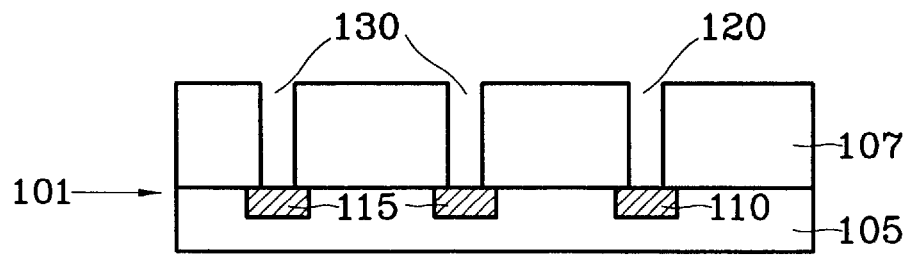
Figure 3:
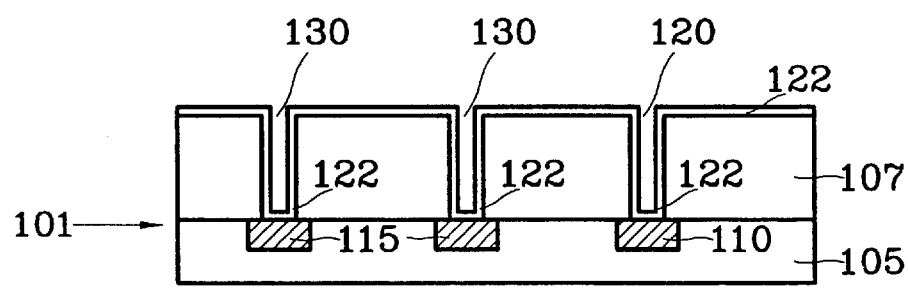
Figure 4:
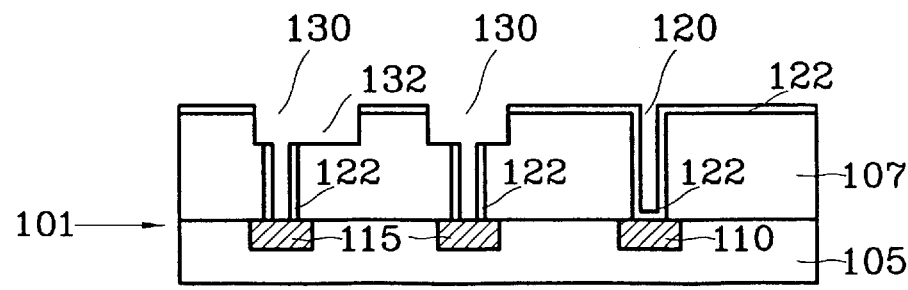
Figure 5:
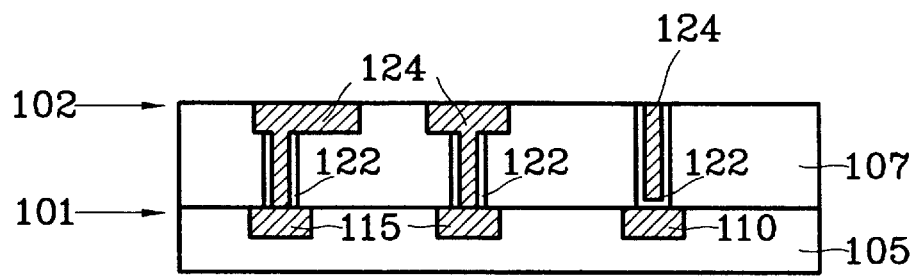
Figure 6:
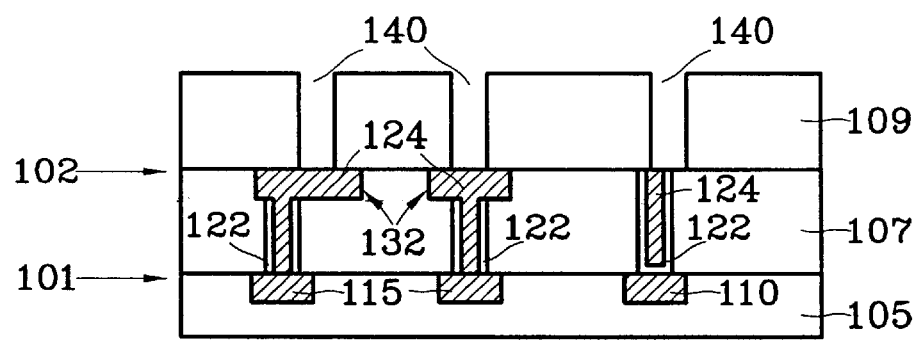
Figure 7:
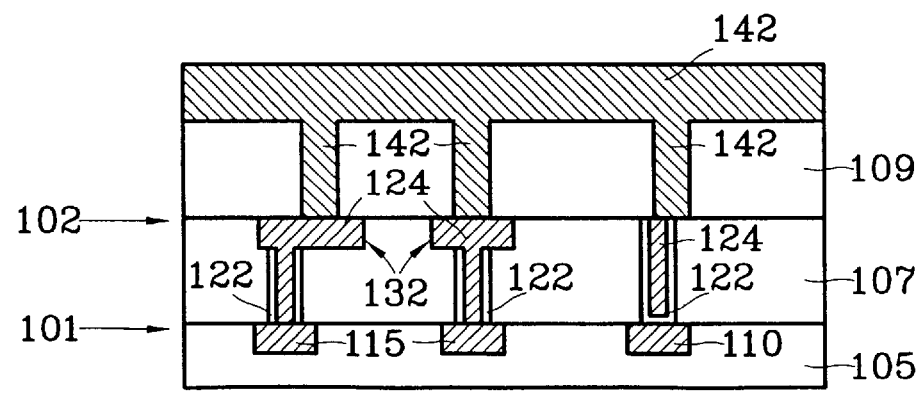

The present invention will now be described more fully with reference to the accompanying drawings, in which a preferred embodiment of the invention is shown. This invention may, however, be embodied in many different forms and should not be construed as being limited to the embodiment set forth herein. Rather, this embodiment is provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or a substrate, it can be directly on the other layer or the substrate, or intervening layers may also be present. The same reference numerals in different drawings represent the same elements.

FIGS. 8 through 14 are cross-sectional views illustrating a method for manufacturing a semiconductor device having a MIM capacitor and a via contact according to an embodiment of the present invention.

Figure 8:
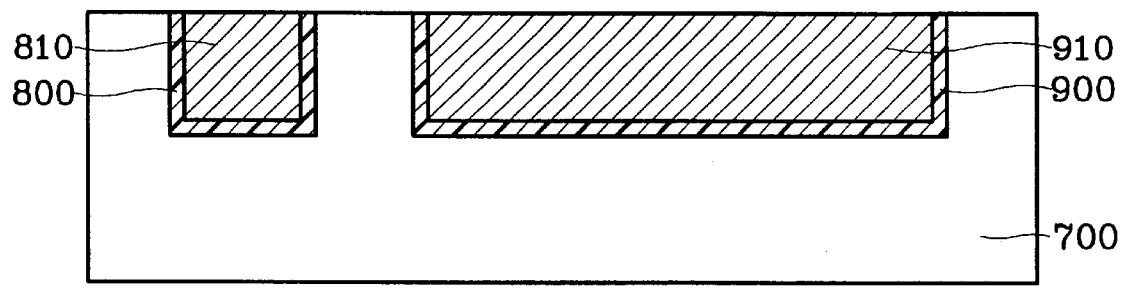
FIGS. 8 through 14 are cross-sectional views illustrating a method for manufacturing a semiconductor device having a capacitor such as a MIM capacitor and a via contact according to an embodiment of the present invention.

As shown in FIG. 8, first and second portions 810 and 910 of a first metal layer are formed a predetermined distance apart on a first interlayer insulating layer 700. The first portion 810 comprises a via contact, and the second portion 910 comprises a MIM capacitor. A first portion 800 of a first barrier metal layer is interposed between the first interlayer insulating layer 700 and the first portion 810, and a second portion 900 of the first barrier metal layer is interposed between the first interlayer insulating layer 700 and the second portion 910 of the first metal layer.

In order to form the first and second portions 810 and 910 of the first metal layer, a mask layer pattern (not shown) is formed on the first interlayer insulating layer 700. The mask layer pattern exposes predetermined portions of the surface of the first interlayer insulating layer 700, where the first and second portions 810 and 910 of the first metal layer are to be formed. Next, trenches are formed to a predetermined depth of the first interlayer insulating layer 700 by etching the first interlayer insulating layer 700 using the mask layer pattern as an etching mask. After removing the mask layer pattern, a barrier metal layer to form the first and second portions 800 and 900 of the first barrier metal layer, and a metal layer to form the first and second portions 810 and 910 of the first metal layer, are sequentially deposited on the first interlayer insulating layer 700. Here, in accordance with one embodiment of the present invention, the barrier metal layer may be formed by, for example, sputtering, and the metal layer may be formed by, for example, forming a copper seed layer and depositing copper on the copper seed layer by electroplating. A person skilled in the art will appreciate that other techniques such as atomic layer deposition (ALD) can be used to form a seed layer.

After forming the barrier metal layer and the metal layer, a planarizing process such as chemical mechanical polishing (CMP) is performed on the resulting structure, until the first and second portions 810 and 910 of the first metal layer are isolated from each other. The first and second portions 810 and 910 of the first metal layer are preferably planarized to have a thickness of about 3000–10000 Å.

Figure 9:
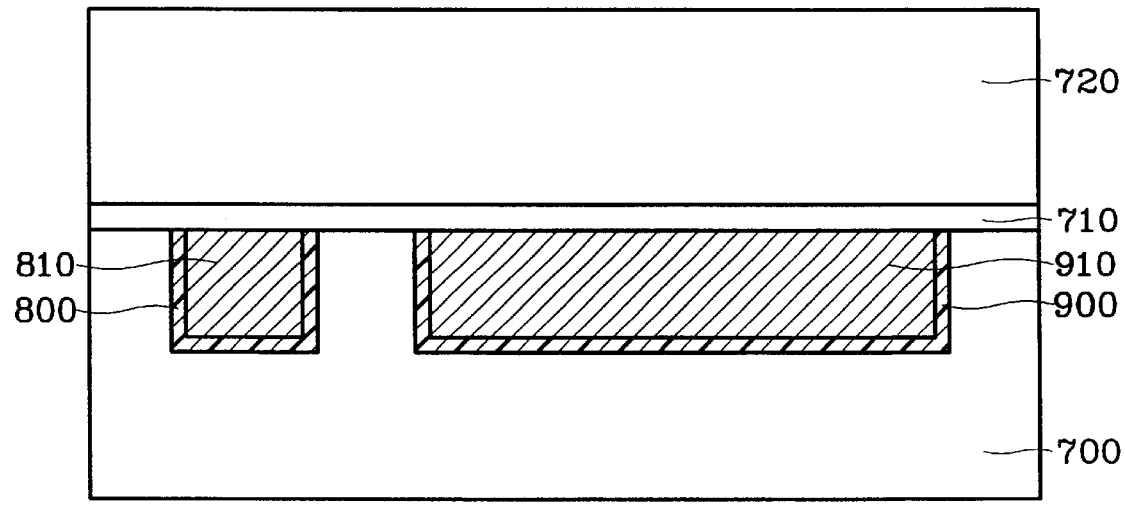

Next, as shown in FIG. 9, a first capping layer 710 and a second interlayer insulating layer 720 are sequentially formed on the first interlayer insulating layer 700 and first and second portions 810 and 910 of the first metal layer. The first capping layer 710 prevents diffusion of metal atoms such as copper atoms in the first and second portions 810 and 910 of the first metal layer and is used as an etching stopper in the subsequent etching process for forming a via contact hole. The first capping layer 710 is preferably formed of nitride to a thickness of about 200–1000 Å. The second interlayer insulating layer 720 is formed of oxide to a thickness of about 300–10000 Å.

Figure 10:
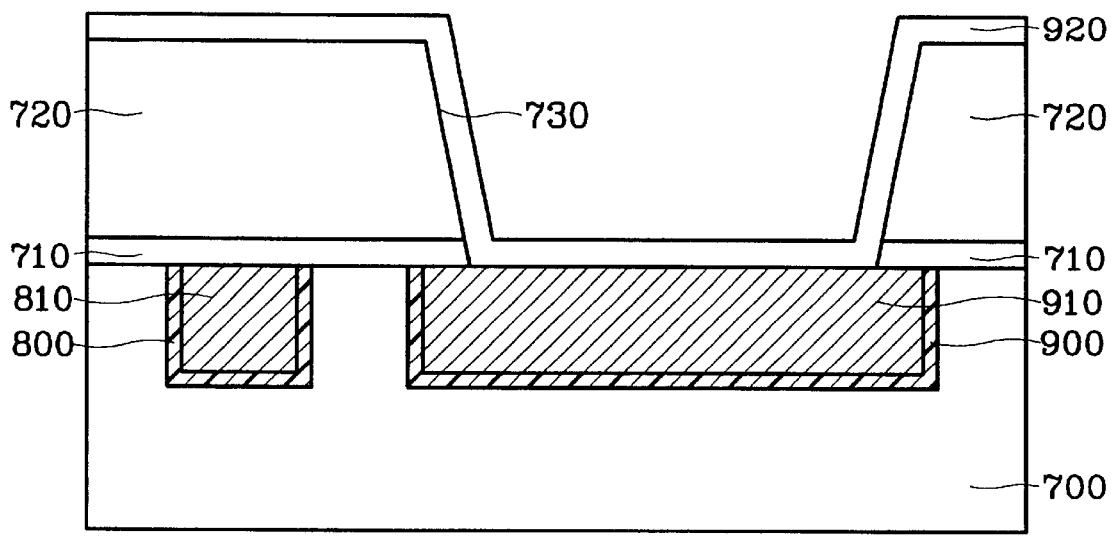

Next, as shown in FIG. 10, a contact hole 730 is formed through the second interlayer insulating layer 720 and the first capping layer 710 to partially expose the second portion 910 of the first metal layer. In particular, to form the contact hole 730, a mask layer pattern (not shown) is formed on the second interlayer insulating layer 720. Next, predetermined portions of the second interlayer insulating layer 720 and the first capping layer 710 are removed by an etching process, using the mask layer pattern as an etching mask. The etching process is performed until the surface of the second portion 910 of the first metal layer is exposed. Next, a capacitor dielectric layer 920 is formed on the resulting structure including the contact hole 730. If the capacitor dielectric layer is formed of nitride, the material used for the first capping layer 710, the etching process may be performed until the surface of the first capping layer 710 is exposed. After the formation of the contact hole 730, the dielectric layer 920 is formed on the exposed portions of the surfaces of the second interlayer insulating layer 720 and the second portion 910 of the first metal layer. The dielectric layer 920 is preferably formed of oxide or nitride by conventional techniques such as chemical vapor deposition (CVD). Alternatively, the dielectric layer 920 may be a composite layer including an oxide layer and a nitride layer. The thickness of the dielectric layer 920 is controlled in accordance with the desired capacitance of a capacitor. For example, if the desired capacitance per unit area is 1.0 fF/Fm2 and the dielectric layer 920 is formed of an oxide layer having a dielectric constant of 3.9, the dielectric layer 920 is formed to a thickness of about 345 D. If the desired capacitance per unit area is 1.0 fF/Fm2 and the dielectric layer 920 is formed of nitride having a dielectric constant of 7.9, the dielectric layer 920 is formed to a thickness of about 664 Å.

Figure 11:
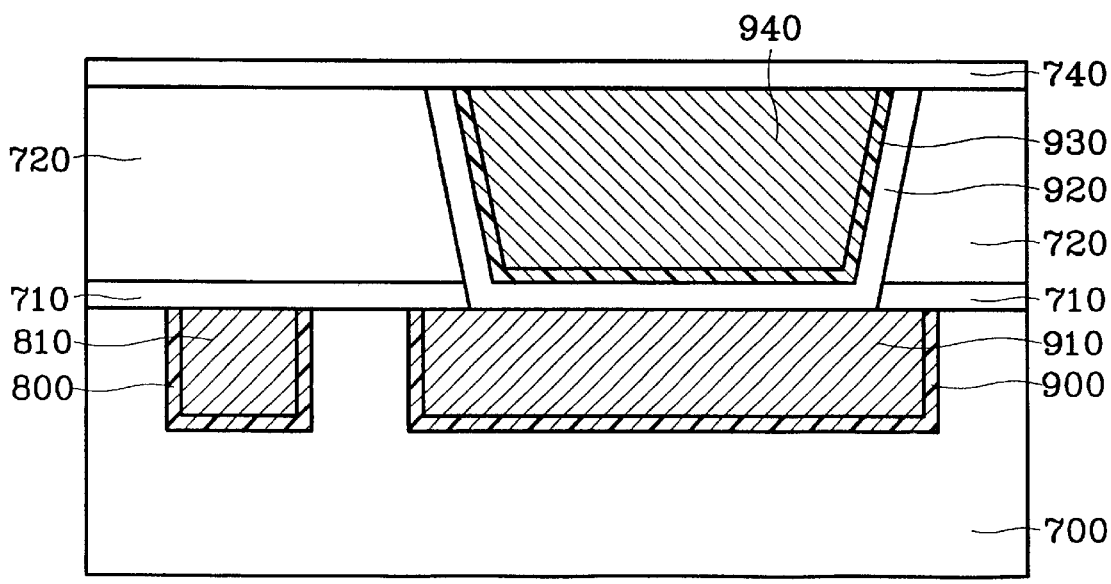

Next, as shown in FIG. 11, a second barrier metal layer 930 and a second metal layer 940 are deposited on the dielectric layer 920. The second barrier metal layer 930 may be deposited by physical vapor deposition techniques such as sputtering. The second barrier metal layer 930 is preferably formed of TaN to a thickness of about 200–1000 Å. The second metal layer 940 may be deposited on the second barrier metal layer 930 by forming a copper seed layer on the second barrier metal layer 930 to a thickness of about 500–2000 Å and depositing copper on the copper seed layer by electroplating. Predetermined portions of the second metal layer 940, the second barrier metal layer 930, and the dielectric layer 920 are removed by planarizing techniques such as CMP until the surface of the second interlayer insulating layer 720 is exposed. Then, the dielectric layer 920 remains only where a MIM capacitor is formed (a capacitor region), and the region, in which a via contact is formed (a via contact region), is covered with the second interlayer insulating layer 720. Accordingly, there is no need to perform an RF etching process for removing a native oxide layer in the via contact region before the formation of the second barrier metal layer 930. Thus, deterioration of the performance of a capacitor due to the RF etching process can be prevented.

Next, a second capping layer 740 is formed on the exposed portions of the second interlayer insulating layer 720, the dielectric layer 920, the second barrier metal layer 930, and the second metal layer 940. The second capping layer 740, like the first capping layer 710, prevents metal atoms such as copper atoms in the second metal layer 940 from diffusing into other regions and is used as an etching stopper in the subsequent etching process for forming a via contact hole. The second capping layer 740 is preferably formed of nitride.

Figure 12:
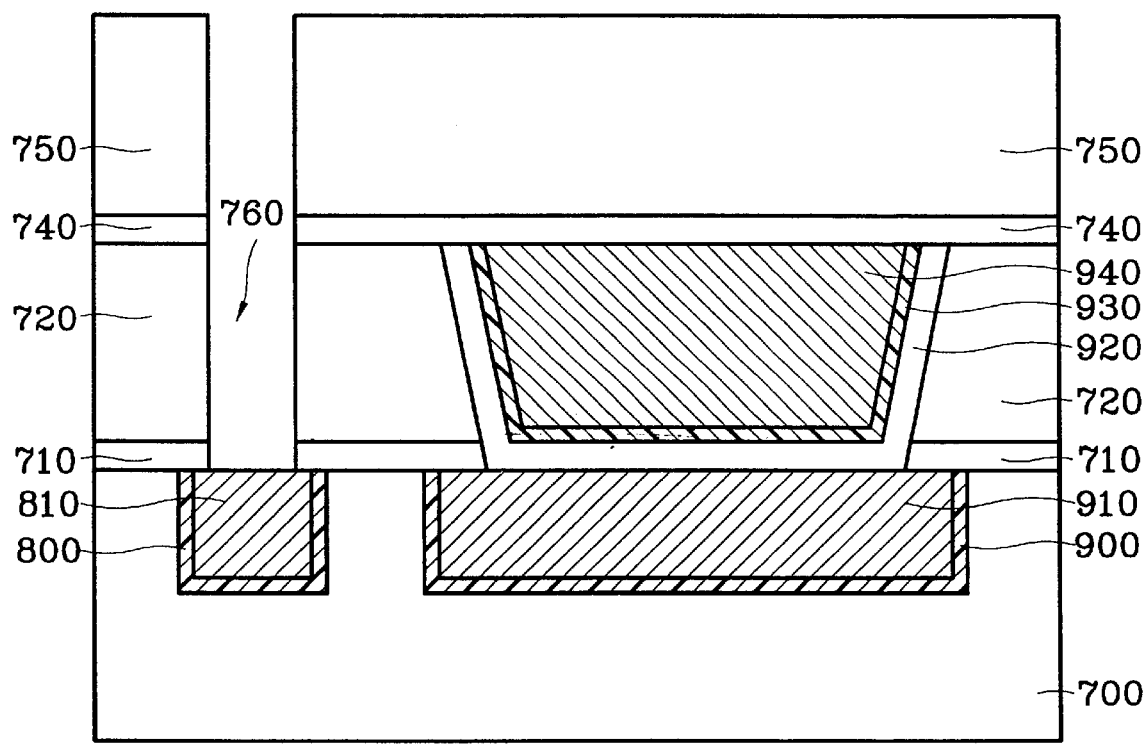

Next, as shown in FIG. 12, a mask layer pattern 750 is formed on the second capping layer 740. The mask layer pattern 750 is a photoresist pattern having an opening that exposes the surface of the second capping layer 740 in the via contact region and covering the capacitor region. Next, the second capping layer 740, the second interlayer insulating layer 720, and the first capping layer 710 are sequentially removed by an etching process to form a via contact hole 760, using the mask layer pattern 750 as an etching mask. The etching process may be a dry etching process. After the formation of the via contact hole 760, the mask layer pattern 750 is removed.

Figure 13:
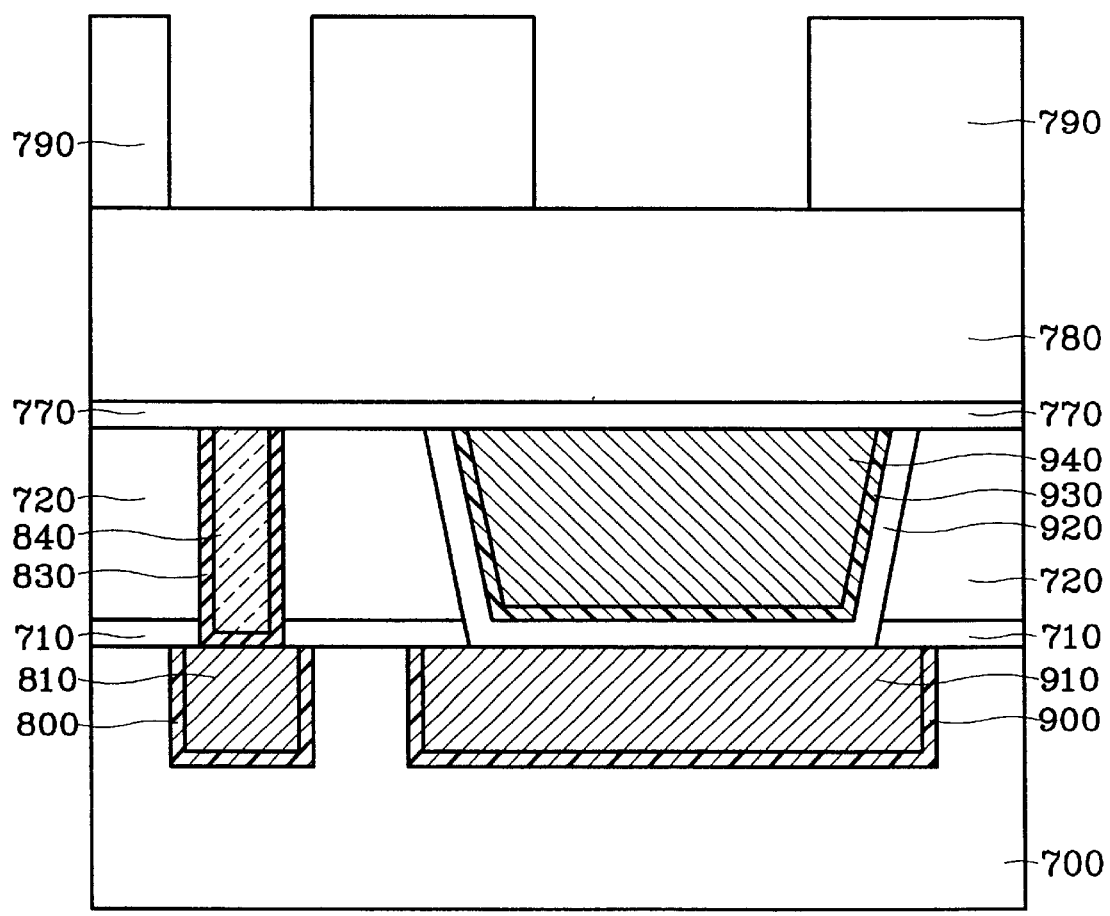

Next, as shown in FIG. 13, the via contact hole 760 of FIG. 12 is filled with a third barrier metal layer 830 and a third metal layer 840. A third capping layer 770, a third interlayer insulating layer 780, and a mask layer pattern 790 are then sequentially formed thereon. Specifically, the third barrier metal layer 830 is deposited on the surface of the resulting structure including the via contact hole 760 preferably by sputtering. The third metal layer 840 is then formed on the third barrier metal layer 830 to fill the via contact hole 760 of FIG. 12. In other words, after the formation of the third barrier metal layer 830, a copper seed layer is formed on the resulting structure including the third barrier metal layer 830, and copper is then deposited on the copper seed layer by electroplating to form the third metal layer 840. Before the formation of the third barrier metal layer 830, a native oxide layer formed on the first portion 810 of the first metal layer is removed by an RF etching process. Because the capacitor region is covered with the second capping layer 740 of FIG. 12 and the mask layer pattern 750 of FIG. 12, it can be protected from the RF etching process. Thus, deterioration of the performance of a capacitor can be prevented.

After the deposition of the third barrier metal layer 830 and the third metal layer 840, predetermined portions of the second capping layer 740 of FIG. 12, the third metal layer 840, and the third barrier metal layer 830 are removed by CMP until the surface of the second interlayer insulating layer 720 is exposed.

Next, the third capping layer 770 is formed on the exposed portions of the second interlayer insulating layer 720, the third barrier metal layer 830 in the via contact region, the third metal layer 840, the dielectric layer 920 in the capacitor region, the second barrier metal layer 930, and the second metal layer 940. The third capping layer 770, like the first and second capping layers 710 and 740, prevents metal atoms such as copper atoms in the third metal layer 840 from diffusing into other regions and is used as an etching stopper in the subsequent etching process. The third capping layer 770 is formed of a nitride layer. Next, the third interlayer insulating layer 780 is formed on the third capping layer 770. The mask layer pattern 790 is then formed on the third interlayer insulating layer 780. The mask layer pattern 790 is a photoresist pattern including openings, through which predetermined portions of the surface of the third interlayer insulating layer 780 in the via contact region and the capacitor region are exposed.

Figure 14:
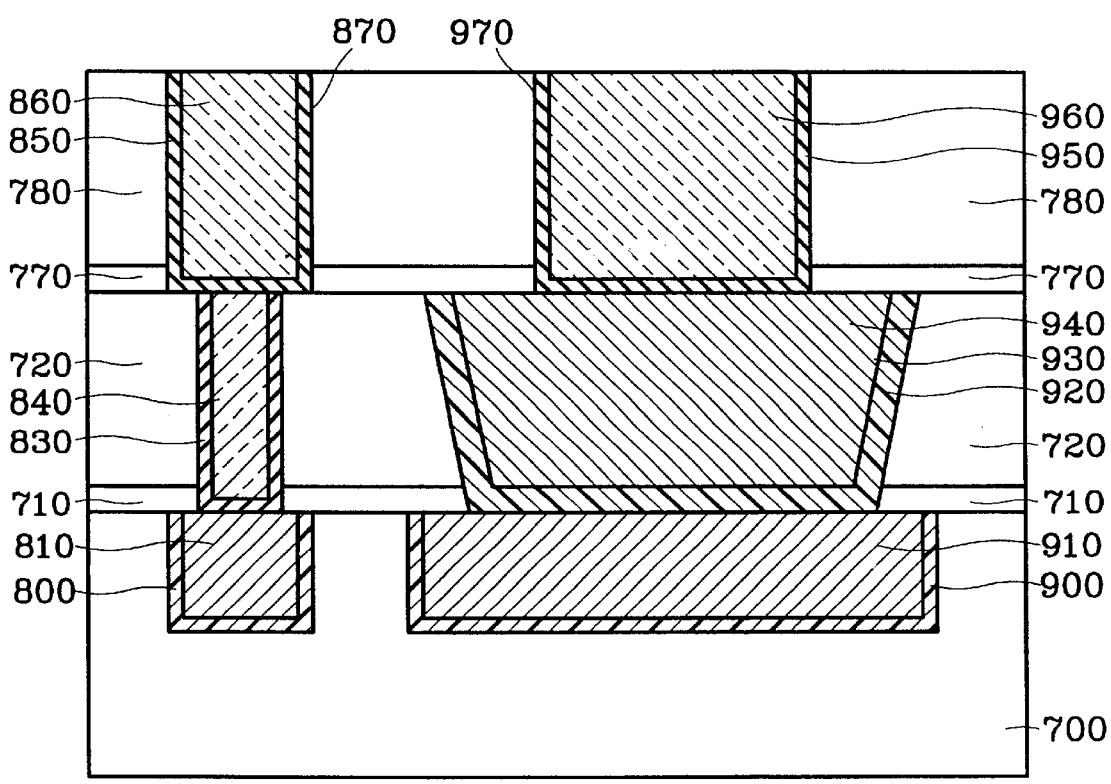

Next, as shown in FIG. 14, the exposed portions of the third interlayer insulating layer 780 and the third capping layer 770 are sequentially removed by an etching process, using the mask layer pattern 790 as an etching mask. The etching process is performed until a predetermined portion of the surface of the second metal layer 940 and the surfaces of the third barrier metal layer 830 and the third metal layer 840 are exposed. As a result of the etching process, a contact hole 970, through which the surface of the second metal layer 940 in the capacitor region is exposed, and a contact hole 870, through which the surface of the third metal layer 840 in the via contact region is exposed, are formed. After the formation of the contact holes 870 and 970, the mask layer pattern 790 is removed.

Next, first and second portions 850 and 950 of a fourth barrier metal layer and first and second portions 860 and 960 of a fourth metal layer are sequentially formed to fill the respective contact holes 870 and 970. Specifically, a barrier metal layer to form the first and second portions 850 and 950 of the fourth barrier metal layer is formed on the resulting structure including the contact holes 870 and 970. Then, a metal layer to form the first and second portions 860 and 960 of the fourth metal layer is formed on the barrier metal layer. The metal layer fills the contact holes 870 and 970. Here, the barrier metal layer may be formed by techniques such as sputtering or ALD. The metal layer may be formed by forming a copper seed layer on the resulting structure and by depositing copper on the copper seed layer. After the deposition of the barrier metal layer and the metal layer, a planarizing process such as CMP is performed on the resulting structure to expose the third interlayer insulating layer 770 to form first and second portions 860 and 960 of a fourth metal layer isolated from each other. Thus, a semiconductor device having a via contact, which consists of the first portion 810 of the first metal layer, the third metal layer 840, and the fourth metal layer 860, and a MIM capacitor, which consists of the second portion 910 of the first metal layer, the dielectric layer 920, the second metal layer 940, and the fourth metal layer 960, is completed.

As described above, the method for manufacturing a semiconductor device having a MIM capacitor and a via contact according to an embodiment of the present invention to the present invention produces the following effects, among others.

First, because a barrier metal layer is formed on a dielectric layer of a capacitor when a via contact hole is covered with an interlayer insulating layer, a process for filling a via contact hole and a process for filling a capacitor contact hole are separately performed. Accordingly, there is no need to perform an RF etching process to remove a native oxide layer before the formation of the barrier metal layer. Thus, damage to the surface of the dielectric layer can be prevented, and deterioration of the performance of a capacitor due to the RF etching process can be prevented.

Secondly, because substantially no insulating material exists on the sidewalls of metal layers to form a via contact, the resistance of the via contact does not increase, but the aspect ratio of the via contact hole decreases. Accordingly, it becomes easier to perform the subsequent process for depositing metal layers.

Thirdly, because a damascene process is employed for manufacturing a semiconductor device having a MIM capacitor and a via contact according to an embodiment of the present invention, contact interconnections and a capacitor electrode using copper that has relatively good electrical characteristics can be formed, providing an interconnection structure and a capacitor electrode having low electric resistance.

Fourthly, since a capping layer is used as an etching stopper, masks used to form alignment keys are unnecessary.

While this invention has been particularly shown and described with reference to preferred embodiments thereof, it will be understood by those skilled in the art that various modifications in form and details may be made therein without departing from the spirit and scope of the invention as defined by the appended claims.

What is claimed is:

1. A method for manufacturing a semiconductor device having a via contact and a MIM capacitor, the method comprising:

forming first and second portions of a first metal layer a distance apart in trenches formed in a first interlayer insulating layer;

forming a second interlayer insulating layer covering the first portion of the first metal layer in a via contact region, the second interlayer insulating layer having an opening that exposes the second portion of the first metal layer in a capacitor region;

forming a dielectric layer on the exposed second portion of the first metal layer;

forming a second metal layer over the dielectric layer to fill the opening in the capacitor region;

after filling the opening with the second metal layer, forming a via contact hole in the second interlayer insulating layer to expose the first portion of the first metal layer;

forming a third metal layer in the via contact hole;

forming a third interlayer insulating layer overlying the second interlayer insulating layer, second metal layer, and the third metal layer;

forming contact holes in the third interlayer insulating layer to expose the second metal layer and the third metal layer; and forming a fourth metal layer in the contact holes.

2. The method of claim 1, wherein forming the first and second portions of the first metal layer comprises:

forming a mask layer pattern that exposes the via contact region and the capacitor region on the first interlayer insulating layer;

forming first and second trenches in the via contact region and the capacitor region, respectively, by etching the first interlayer insulating layer;

removing the mask layer pattern;

forming a metal layer to fill the trenches; and forming the first and second portions of the first metal layer to be isolated from each other by planarizing the resulting structure including the metal layer to expose the surface of the first interlayer insulating layer.

3. The method of claim 2 further comprising forming a first barrier metal layer between the first interlayer insulating layer and the first metal layer.

4. The method of claim 1 further comprising forming a first capping layer on the surfaces of the first interlayer insulating layer and the first metal layer after forming the first metal layer.

5. The method of claim 4, wherein the first capping layer is formed of nitride to a thickness of 200–1000 Å.

6. The method of claim 4, wherein the second interlayer insulating layer and the first capping layer are etched to have an opening therein to expose the surface of the first metal layer in the capacitor region.

7. The method of claim 1, wherein the dielectric layer is an oxide layer, a nitride layer, or a composite layer including an oxide layer and a nitride layer.

8. The method of claim 1, wherein the second interlayer insulating layer is formed of oxide to a thickness of 3000–10000 Å.

9. The method of claim 1, wherein forming the second metal layer comprises:

forming a metal layer on the dielectric layer; and planarizing the resulting structure including the metal layer to expose the surface of the second interlayer insulating layer to form the second metal layer.

10. The method of claim 9 further comprising forming a second barrier metal layer between the dielectric layer and the second metal layer.

11. The method of claim 1 further comprising performing an RF etching process in a state where a first mask layer pattern remains after forming the via contact hole to remove a native oxide layer on the first portion of the first metal layer in the via contact region.

12. The method of claim 1 further comprising a second capping layer on the surfaces of the second interlayer insulating layer and the second metal layer after forming the second metal layer.

13. The method of claim 12, wherein the second capping layer is formed of nitride.

14. The method of claim 1 further comprising forming a third barrier metal layer on the first metal layer in the via contact region before forming the third metal layer.

15. The method of claim 1 further comprising forming a fourth barrier metal layer on the second metal layer and the third metal layer in the contact holes before forming the fourth metal layer.

16. The method of claim 1, wherein the first metal layer, the second metal layer, the third metal layer, and the fourth metal layer are formed of copper.

17. The method of claim 16, wherein the first metal layer, the second metal layer, the third metal layer, and the fourth metal layer are formed by forming a copper seed layer and depositing copper on the copper seed layer by electroplating.

18. The method of claim 17, wherein forming a copper seed layer comprises sputtering, or atomic layer deposition (ALD).

19. A method for manufacturing a semiconductor device having a via contact and a MIM capacitor, the method comprising:

forming spaced apart first and second portions of a first metal layer in a first interlayer insulating layer;

forming a second interlayer insulating layer covering the first portion of the first metal layer, the second interlayer insulating layer having an opening to expose the second portion of the first metal layer;

forming a dielectric layer on the exposed second portion of the first metal layer;

forming a second metal layer over the dielectric layer to fill the opening;

after filling the opening with the second metal layer, forming a via contact hole in the second interlayer insulating layer to expose the first portion of the first metal layer; and forming a third metal layer in the via contact hole.

20. The method of claim 19 further comprising:

forming a third interlayer insulating layer overlying the second interlayer insulating layer, second metal layer, and the third metal layer;

forming contact holes n the third interlayer insulating layer to expose the second metal layer and the third metal layer; and forming a fourth metal layer in the contact holes.

21. The method of claim 19, wherein the first portion of the first metal layer is in a via contact region and the second portion of the first metal layer is in a MIM capacitor region.

* * * * *

UNITED STATES PATENT AND TRADEMARK OFFICE
CERTIFICATE OF CORRECTION

PATENT NO. : 6,649,464 B2
DATED : November 18, 2003
INVENTOR(S) : Lee

It is certified that error appears in the above-identified patent and that said Letters Patent is hereby corrected as shown below:

Colume 10,
Line 22, "holes n the third" should read -- holes in the third --.

Signed and Sealed this

Twenty-ninth Day of June, 2004

JON W. DUDAS
*Acting Director of the United States Patent and Trademark Office*